(12) United States Patent
Akutsu et al.

(10) Patent No.: US 6,224,735 B1
(45) Date of Patent: *May 1, 2001

(54) PROCESS FOR RECORDING IMAGE

(75) Inventors: Eiichi Akutsu; Shigemi Ohtsu; Lyong sun Pu, all of Nakai-machi (JP)

(73) Assignee: Fuji Xerox Co. Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/317,181

(22) Filed: May 24, 1999

(30) Foreign Application Priority Data

May 27, 1998 (JP) .................................... 10-145795

(51) Int. Cl.$^7$ .................................................. C25D 5/00
(52) U.S. Cl. ........................... 205/91; 205/123; 205/118; 205/157; 205/162; 205/221; 205/229; 205/317
(58) Field of Search ............................. 205/91, 123, 340, 205/221, 317, 229, 162, 157, 118

(56) References Cited

U.S. PATENT DOCUMENTS

| | | | |
|---|---|---|---|
| 5,080,470 | * | 1/1992 | Warszawski .................. 359/265 |
| 5,185,074 | * | 2/1993 | Yokoyama et al. ................. 205/162 |
| 5,627,010 | * | 5/1997 | Pai et al. ........................ 430/270.1 |
| 6,025,101 | * | 2/2000 | Ohtsu et al. ......................... 430/52 |

FOREIGN PATENT DOCUMENTS

| | | |
|---|---|---|
| 5-119209 | 5/1993 | (JP) . |
| 5-157905 | 6/1993 | (JP) . |
| B2-2603468 | 1/1997 | (JP) . |

OTHER PUBLICATIONS

M. Futsuhara et al., "A Micropattern Formation by the Photoinduced Electrodeposition Coating", *Journal of the Oil, and Colour Chemists' Association*. No date available.

"A Micropattern Formation by the Photoelectrochemical Reactions on Semiconductor Electrodes", *Techno–Cosmos*, vol. 1, (1992). No month available.

Yoneyama, H. et al, "Photoelectrochromic Properties of Polypyrrole–Coated Silicon Electrodes," J. Electrochem. Soc.: Electrochemical Science and Technology, Oct. 1985, vol. 132, No. 10, pp. 2414–2417.

Hamasaki, Y. et al., "Photoelectrochemical Properties of Anatase and Rutile Films Prepared by the Sol–Gel Method," J. Electrochem. Soc., vol. 141, No. 3, Mar. 1994, pp. 660–663.

* cited by examiner

*Primary Examiner*—Kathryn Gorgos
*Assistant Examiner*—Christopher M. Keehan
(74) *Attorney, Agent, or Firm*—Oliff & Berridge, PLC

(57) ABSTRACT

A transparent support having formed thereon a transparent conductive film and an organic or inorganic semiconductor thin film that generates an electromotive force by irradiation of light formed on the transparent conductive film, and an aqueous electrolytic solution containing a solvent, a coloring material and a polymer electrodeposition material, whose solubility in the solvent changes depending on the change of pH are prepared; the substrate and a counter electrode connected to the substrate are arranged in such a manner that an surface of the substrate, on which the semiconductor thin film is formed, and the counter electrode are immersed in the aqueous electrolytic solution; the transparent support is selectively irradiated with light; an electrodeposition film having the coloring material and the polymer electrodeposition material is deposited on a part of the support, on which an electromotive force is generated; and the deposited electrodeposition film is brought into contact with an aqueous liquid having a deposition initiating pH, at which the polymer electrodeposition material initiates to be deposited, or with an aqueous liquid having a pH on the side, on which the polymer electrodeposition material is further deposited more than at the deposition initiating pH.

15 Claims, 5 Drawing Sheets

BEFORE IRRADIATION WITH LIGHT

ON IRRADIATION WITH LIGHT

PROCESS FOR RECORDING IMAGE

FIELD OF THE INVENTION

The present invention relates to a process for recording an image for producing a color filter used in various display devices, such as a CCD camera and a liquid crystal display device, and a color image sensor, and for recording a fine pattern on various substrates. More specifically, it relates to a process for recording an image by electrochemically depositing an electrodeposition film containing a coloring material.

BACKGROUND OF THE INVENTION

As a process for producing a color filter, a dyeing method, a pigment dispersion method, a printing method, an ink jet method and an electrodeposition method are known at present.

In the dyeing method, a water soluble polymer film is formed on a glass substrate, and the water soluble polymer film is patterned into a desired shape through a photolithography process. The substrate is then immersed in a dyeing solution to obtain a pattern of the dyed water soluble polymer. These steps are repeated for each colors, red (R), green (G) and blue (B), to obtain a color filter layer. The filter thus obtained has a high transmissibility and large variety of colors. Since the dyeing method is highly sophisticated, this method is often used in a color solid state imaging device (CCD). However, this method is inferior in light resistance because a dye is used, and the numbers of steps in the production process are large. Therefore, in recent years, a pigment dispersion method is employed for the production method of a liquid crystal display device (LCD) instead of the dyeing method.

The pigment dispersion method is the recent main stream of the production method of a color filter. In this method, a resin layer having a pigment dispersed therein is formed on a glass substrate, and the resin layer is patterned through a photolithography process. This is repeated for each colors, R, G and B, to obtain a color filter layer. While the pigment dispersion method is sophisticated, it is disadvantageous in that the numbers of steps in the process are large, and the production cost is high.

In the printing method, a step of printing an image on a substrate by using a thermosetting resin having a pigment dispersed therein is repeated for each colors, R, G and B, and the resin on the substrate is hardened by heating, to obtain a color filter layer. In this method, a photolithography process is not necessary in the formation of the R, G and B layers, but the resolution and the uniformity in film thickness are inferior.

In the ink jet method, after an ink receiving layer has been formed on a substrate with a water soluble polymer, a part of the ink receiving layer is treated to be hydrophilic, and the other part is treated to be hydrophobic, followed by spraying an ink to the hydrophilic part, to obtain a color filter layer. In this method, a photolithography process is not necessary in the formation of the R, G and B layers, but the resolution is low because the minimum pixel size is determined by the size of a droplet of the ink. Furthermore, there is a high possibility in this method that droplets of the ink is scattered to produce mixed colors between the filter layers adjacent to each other, and the yield is low.

In the electrodeposition method, a high voltage of about 70 V is applied to a transparent electrode, which has been patterned, in a electrolytic solution having a water soluble polymer and a pigment dispersed therein, to form an electrodeposition film on the electrode. These steps are repeated for each colors, R, G and B, to obtain a color filter layer. In this method, it is necessary to previously pattern the transparent electrode used as an electrode for electrodeposition by photolithography, and it cannot be used for producing a color filter of a TFT liquid crystal display because the shape of the pattern is restricted.

In a color filter of a liquid crystal display, each pixel as a micro-cell generally should be covered with a black matrix, and photolithography is generally employed for producing the black matrix. However, although fine production precision can be obtained by this method, it requires a large number of steps and a large equipment cost, which result in increase in cost. Therefore, a simple process for producing a color filter without using photolithography is demanded.

On the other hand, documents containing color images widely spread throughout society, and a demand for high resolution, is being increased along with the development of a CPU. In order to satisfy the demand, a printing method using light is proposed, and a simple technique is also demanded in production of a color filter.

Various proposals have been made for a method for forming an image by utilizing light. For example, a method for recording an image is reported in H. Yoneyama, et al., *J. Electrochem. Soc.*, p. 2414 (1985), in which pyrrole is electrolytically polymerized by irradiating with light on a Si substrate, and an image is formed by doping and dedoping of the resulting polypyrrole. This method for recording an image using polypyrrole has an advantage in that it can be conducted with a low voltage of 1.0 V or less. However, this method utilizes the color owned by polypyrrole itself and is not suitable for producing a color filter. Furthermore, a thin film cannot be produced by this method. As a method of utilizing light in the production of a color filter, JP-A-5-119209 and JP-A-5-157905 disclose a method, in which a semiconductor maintaining an exposure effect for a certain period (i.e., a semiconductor having a photo-memory property) is irradiated with light, and the semiconductor is immersed in an aqueous electrodeposition solution with applying a voltage of from 20 to 80 V, to obtain a filter layer. This method utilizes an outer photoelectric effect, in which a semiconductor is irradiated with light to increase an electric current that appears on application of a high bias voltage to the semiconductor, so as to increase the conductivity of the semiconductor. However, unevenness in electric current density is liable to be formed, and it is difficult to form a uniform film with good quality.

SUMMARY OF THE INVENTION

The invention has been made in view of the circumstances described above.

An object of the invention is to provide a process for recording an image in which input with light can be conducted, and an image of high quality can be easily recorded.

Another object of the invention is to apply the process for recording an image to a process for producing a color filter in which a photolithography technique is not used, the number of steps on production is small, and the color filter having high resolution and excellent light transmissibility can be produced with good controllability and a low cost.

The inventors have paid attention to the fact that some electrodeposition materials among water soluble polymers have a solubility which quickly changes depending on the change of pH in a solvent. For example, a certain water soluble acrylic resin is dissolved owing to ionic dissociation in a weak alkali solution having a pH of from 8 to 9, but precipitates at a pH of less than 7 since it cannot suffer ionic dissociation. In general, the solubility of polymer materials having a carboxyl group as a hydrophilic group largely change depending on the change in hydrogen ion concentration (pH) even though no structural change is accompanied. For example, some anionic aqueous dispersing agents are dissolved in water at a pH of 8 or more but precipitate at a pH of 5 or less. When these materials are dissolved in a weakly alkaline water, and a voltage is applied to a platinum electrode immersed in the solution, the following reaction of combining a hole (p) and $OH^{-1}$ ion takes place on the anode side.

$$2OH^{-1} + 2p^+ \rightarrow 0.5(O_2) + H_2O$$

In the vicinity of the anode, the amount of hydrogen ion is increased by thus consuming the $OH^{-1}$ ion in the aqueous solution, to lower the pH. Accordingly, the solubility of the above-described polymer material is decreased to form an electrodeposition film comprising the polymer material on the anode. In the case where the polymer material is transparent, an electrodeposition film having a desired color can be formed by dispersing a pigment in the polymer material.

In order to make the reaction described above take place, water must be dissociated into $OH^{-1}$ ions and hydrogen ions. In order to bring about dissociation of water, a voltage of higher than a certain value (higher than a threshold value) is required, and when the voltage applied is lower than the threshold voltage, an electrodeposition film is not formed even though an electric current flows in the electrode. The inventors have successfully utilized a photo electromotive force generated by irradiating a semiconductor with light to obtain an applied voltage which is higher than the threshold voltage. Accordingly, the formation of an electrodeposition film of high minuteness can be realized.

The electrodeposition film thus obtained is redissolved into the electrodeposition solution due to ionic dissociation by applying a reverse voltage thereto or immersing it in an aqueous solution of pH of 10 to 12. This phenomenon means that when the electrodeposition film remains in the electrodeposition solution, the strength of the electrodeposition film may be deteriorated or the thickness thereof is decreased. The inventors have then conducted research to increase the strength of the electrodeposition film thus obtained to complete the invention.

The invention relates to a process for recording an image comprising a step of preparing a substrate comprising a transparent support having formed thereon a transparent conductive film and an organic or inorganic semiconductor thin film that generates an electromotive force by irradiation of light formed on the transparent conductive film, and an aqueous electrolytic solution containing a solvent, a coloring material and a polymer electrodeposition material, whose solubility in the solvent changes depending on the change of pH; arranging the substrate and a counter electrode connected to the substrate in such a manner that an surface of the substrate, on which the semiconductor thin film is formed, and the counter electrode are immersed in the aqueous electrolytic solution; selectively irradiating the substrate with light; and depositing an electrodeposition film comprising the coloring material and the polymer electrodeposition material on a part of the substrate, on which an electromotive force is generated; and a step of contacting the deposited electrodeposition film with an aqueous liquid having a deposition initiating pH, at which the polymer electrodeposition material initiates to be deposited, or with an aqueous liquid having a pH on the side, on which the polymer electrodeposition material is further deposited more than at the deposition initiating pH.

In the process for recording an image of the invention, after the deposition of the electrodeposition film, the deposited electrodeposition film is brought into contact with an aqueous liquid having a deposition initiating pH, at which the polymer electrodeposition material initiates to be deposited, or a pH on a side, on which the polymer electrodeposition material is deposited more than at the deposition initiating pH. Thus, the ionic dissociation of the part of the molecular chain that still maintains the state of ionic dissociation of the polymer electrodeposition material is suppressed, and an unnecessary electrolytic solution is removed, so as to obtain a durable electrodeposition film. Furthermore, in the case where the process is applied to the production of a color filter, because patterning of the transparent conductive film is not needed, which has been required in the conventional electrodeposition method having been generally employed, the lithography step can be omitted.

DETAILED DESCRIPTION OF THE INVENTION

Figure 1A:
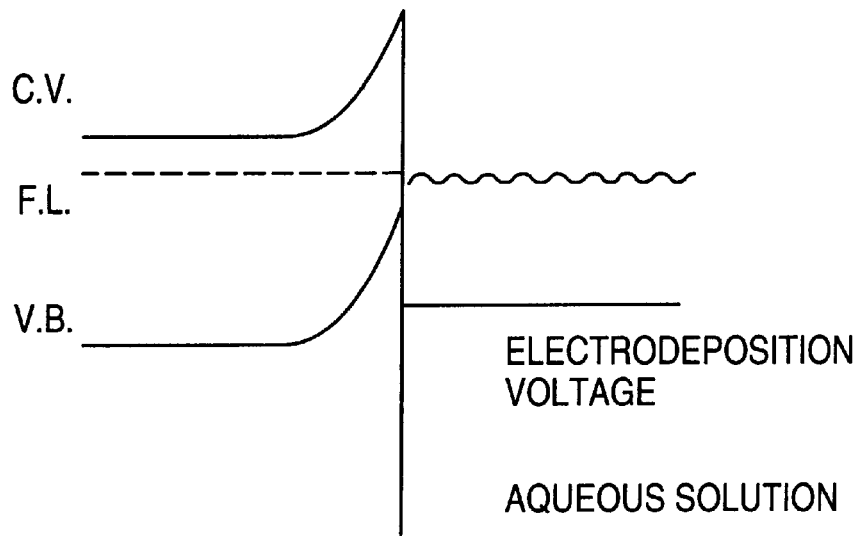
FIG. 1A is a schematic diagram showing a Schottky junction.

In the invention, a substrate comprising a transparent support having formed thereon a transparent conductive film and an organic or inorganic semiconductor thin film that generates an electromotive force by irradiation of light formed on the transparent conductive film is employed. As the transparent support, glass, such as quartz glass, non-alkali glass and Pyrex glass, can be used. As the transparent conductive film, known materials, such as ITO, can be used. As the organic or inorganic semiconductor thin film that generates an electromotive force by irradiation of light, that having no photo-memory property (exhibiting substantially no photo hysteresis effect) can be used. Specifically, examples of the organic semiconductor include polyvinyl carbazole, polyacetylene, a phthalocyanine pigment series material, a perylene pigment series material and an azo pigment series material, and examples of the inorganic semiconductor include Si, GaN, a-C, BN, SiC, ZnSe, $TiO_2$, ZnO, a GaAs series compound, CuS and $Zn_3P_2$. These semiconductors may be used singly or may be used as a mixture. The semiconductor thin film may be a single layer or may have a multi-layer structure. In the semiconductor film, mixing of an insulating material, such as a resin, should be avoided to obtain with ease an electromotive force necessary for deposition by the electrodeposition method because the insulating material may cause generation of a large photo hysteresis effect to increase the electric resistance. While the semiconductor includes an n-type semiconductor and a p-type semiconductor, both types of semiconductors can be used in the invention. Furthermore, a semiconductor film having a multi-layer structure utilizing a pn junction obtained by laminating an n-type semiconductor and a p-type semiconductor in this order, or a pin junction obtained by laminating an n-type semiconductor, an i-type semiconductor and a p-type semiconductor in this order. By using such semiconductor film having a multi-layer structure, a photoelectric current smoothly flows to ensure the generation of the electromotive force, and the contrast of the image is improved. As the semiconductor thin film, titanium oxide ($TiO_2$) is preferred since it is transparent to the visible rays, can be exposed from the side of the transparent support, and has a good photo-irradiation efficiency.

$TiO_2$ is a transparent oxide semiconductor, and generates a photo electromotive force upon irradiation of an ultraviolet ray. Therefore, a photoelectrodeposition film can be formed on the transparent substrate by irradiating the substrate with an ultraviolet ray from the side of the transparent support. Some methods have been known as the methods for forming a $TiO_2$ film. For example, a thermal oxidation method, a sputtering method, an electron beam method (an EB method) and a sol-gel method are exemplified. The inventors have conducted the film formation of $TiO_2$ by an EB method and a sol-gel method, but the voltage necessary for electrodeposition has not obtained due to a low photo electromotive force conversion efficiency by the normal film formation method. The inventors have then conducted a reducing treatment to increase the photoelectromotive force conversion efficiency. In a general reducing treatment of $TiO_2$, it is heated to about 550° C. in a hydrogen gas. For example, in Y. Hamasaki et al., *J. Electrochem. Soc.*, vol. 141, No. 3, p. 660 (1994), $TiO_2$ is heated to about 550° C. for about 1 hour in a hydrogen gas. However, the inventors have obtained a satisfactory result by a treatment at a low temperature of about 360° C. for a short period of time of 10 minutes. This has been attained by heating $TiO_2$ in a stream of a nitrogen gas containing 3% of hydrogen at a flow rate of 1 L per 1 minute.

The thickness of the semiconductor thin film is preferably from 0.05 to 3 μm to obtain good characteristics. When the thickness of the semiconductor thin film is less than 0.05 μm, the photoelectromotive force is too small to sufficiently form an image. When the thickness of the semiconductor thin film exceeds 3 μm, an electric charge generated by light is trapped in the thin film to exceedingly increase the photohysteresis, and an image of good quality cannot be formed.

The invention employs, in addition to the above-described substrate, an aqueous electrolytic solution containing a solvent, a coloring material and a polymer electrodeposition material, whose solubility in the solvent changes depending on change of pH. Examples of the solvent include water; an alcohol, such as methanol, ethanol, butanol and isopropyl alcohol; a ketone, such as acetone and methyl ethyl ketone; an amine, such as ethanolamine, dimethylamine and triethanolamine; and an acid, such as acetic acid, sulfuric acid, phosphoric acid, oxalic acid and phthalic acid. These may be singly or in combination of plurality of them. Among these, a solvent (or dispersion medium) containing water as a main component is extremely advantageous from the standpoint of safety, stability and cost.

The coloring material is appropriately selected depending on the color tone of the electrodeposition film to be formed. Examples of the coloring material of a dye series which can be used include an acidic dye having a carboxyl group as a free group (such as rose bengal, erythrocyn, Brilliant Blue and gardenia blue dye); and a basic dye, particularly a basic dye having an amino group or a derivative group thereof (such as Victoria Blue B, Methyelene Blue and Rhodamine 6G). Examples of the coloring materials of a dye series and a pigment series that are not dissolved in water or has a low solubility in water, include an inorganic pigment (such as carbon black, titanium oxide, zinc white, red iron oxide, alumina white, aluminum powder, bronze powder, zinc oxide, barium sulfate, magnesium carbonate, ultramarine, chrome yellow, cobalt blue and Prussian blue); an organic pigment (such as Toluidine Red, Permanent Carmine FB, Fast Yellow G, Disazo Yellow AAA, Disazo Orange PMP, Lake Red C, Brilliant Carmine 6B, phthalocyanine blue, indanthron blue, quinacridone red, dioxazine violet, Victoria Pure Blue, Alkali Blue Toner, Aniline Black, Permanent Red 2B, Barium Lithol Red, quinacridone magenta, Naphthol Red HF4B, phthalocyanine green and benzimidazolone red); an oil soluble dye (such as Victoria Blue 4R base, Nigrosine, Nigrosine base, C.I. Solvent Yellow 19, C.I. Solvent Orange 45 and C.I. Solvent Red 8); a disperse dye; a dyeing lake pigment; and resin powder comprising a resin containing a coloring substance. In the case where a color filter is produced by the process for recording an image of the invention, a pigment excellent in light resistance is preferably used as the coloring material.

The polymer electrodeposition material, whose the solubility in a solvent changes depending on the change of pH, is preferably a copolymer comprising a monomer containing a hydrophilic group and a monomer containing a hydrophobic group, and a random copolymer is more preferred. The hydrophobic group of the polymer electrodeposition material has a high affinity to the organic pigment used and an adsorbing function, and thus imparts a good pigment dispersion function to the polymer electrodeposition material. Furthermore, the hydrophobic group also has a function in that when the hydrophilic group changes from the dissociated state to the non-dissociated state due to the application of a voltage, the electrodeposition material is immediately deposited. The number of the hydrophobic group contained in the copolymer is preferably from 40 to 80% of the total number of the hydrophobic group and the hydrophilic group. When the number of the hydrophobic group is less than 40% of the total number of the hydrophilic group and the hydrophobic group, the water resistance of the electrodeposition film thus formed is poor, and the film strength is low. When the number of the hydrophobic group exceeds 80% of the total number of the hydrophilic group and the hydrophobic group, the solubility of the polymer electrodeposition material in the aqueous electrolytic solution is insufficient, which results in that the aqueous electrolytic solution becomes turbid, the electrodeposition material precipitates under normal conditions, and the viscosity of the aqueous electrolytic solution is increased. The polymer electrodeposition material having the hydrophobic group of the number ranging from 40 to 80% of the total number of the hydrophilic group and the hydrophobic group exhibits a high effect of decreasing the threshold voltage for forming a durable film and is suitable in a process for recording an image using a low voltage obtained by a photoelectromotive force. In the case where the number of the hydrophobic group is from 55 to 70% of the total number of the hydrophilic group and the hydrophobic group, the deposition effect is high, and the characteristics of the aqueous electrolytic solution is stable.

Furthermore, it is possible that 50% or more, more preferably 75% or more, of the hydrophilic group of the polymer electrodeposition material preferably is capable of ionicly dissociating. One having a carboxyl group, an amino group or an imino group as the hydrophilic group capable of ionicly dissociating exhibits a good deposition efficiency of an image in the electrodeposition phenomenon and can provide an electrodeposition film having a high durability.

Examples of the monomer containing the hydrophilic group include a methacrylic acid, acrylic acid, hydroxyethyl methacrylate, acrylamide, maleic anhydride, trimellitic anhydride, phthalic anhydride, hemimellitic acid, succinic acid, adipic acid, propiolic acid, propionic acid, fumaric acid, itaconic acid and a derivative thereof. Among these, methacrylic acid and acrylic acid are preferred since they exhibit an excellent electrodeposition efficiency depending on the change of pH and have a high hydrophilic property. These may be used singly or in combination of two or more of them.

Examples of the monomer containing the hydrophobic group include an alkyl group, a styrene group, an α-methylstyrene group, α-ethylstyrene group, a methyl methacrylate group, a butyl methacrylate group, an acrylonitrile group, a vinyl acetate group, an ethyl acrylate group, a butyl acrylate group, a lauryl methacrylate group and a derivative thereof. Among these, a styrene group and an α-methylstyrene group are preferred because these are high in hydrophobic property and are easy to control the molecular weight of the polymer electrodeposition material in the production of the polymer. These may be used singly or in combination of two or more of them.

In order to obtain good film characteristics and strength, the number average molecular weight of the polymer electrodeposition material is preferably from 6,000 to 30,000, and more preferably from 9,000 to 20,000. When the number average molecular weight is less than 6,000, the film becomes non-uniform and is low in water resistance. Thus, an electrodeposition film having high durability cannot be obtained, and a part of the film becomes powder due to the low film forming property. When the number average molecular weight is more than 30,000, it is difficult to be dissolved in the aqueous electrolytic solution, so that the solid concentration of the aqueous electrolytic solution is difficult to be increased to the proper value; the aqueous electrolytic solution becomes turbid; a precipitate is formed; and the viscosity of the aqueous electrolytic solution is increased.

An electrodeposition material having a glass transition point of lower than 100° C., a flow initiating point of lower than 180° C. and a decomposition point of higher than 130° C. is preferred since it exhibits a wide degree of freedom in the transferring temperature in the case where heat is used in the transferring step described later, so that the electrodeposition film can be transferred in good conditions.

The acid value of the polymer electrodeposition material of the type of depositing on an anode is preferably from 60 to 300 to obtain good electrodeposition characteristics, and more preferably from 70 to 180. When the acid value of the polymer electrodeposition material is less than 60, its solubility in the aqueous electrolytic solution becomes insufficient, so that the solid concentration of the aqueous electrolytic solution is difficult to be increased to the proper value; the aqueous electrolytic solution becomes turbid; a precipitate is formed; and the viscosity of the aqueous electrolytic solution is increased. When the acid value of the polymer electrodeposition material exceeds 300, the water resistance of the film formed is low, and the electrodeposition efficiency for the amount of electricity supplied becomes low.

Figure 1B:
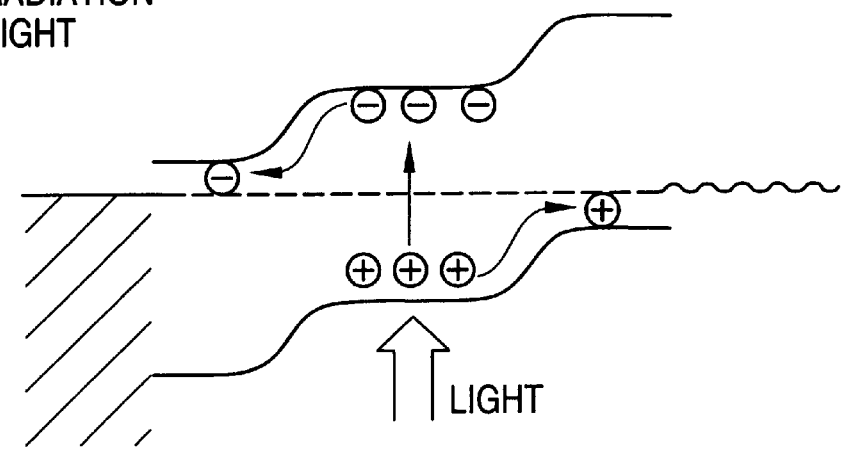
FIG. 1B is a schematic diagram showing an energy band of a semiconductor having a pin junction.

The polarity of the polymer electrodeposition material is selected corresponding to the polarity of the semiconductor used. As well known in the field of solar cells, the formation of a photoelectromotive force is conducted by utilizing a Schottky barrier or a pn or pin junction formed at an interface contacting with the semiconductor. One example of an n-type semiconductor will be described with reference to the schematic diagrams of FIGS. 1A and 1B. FIG. 1A shows the energy band of a semiconductor in the case of a Schottky junction, and FIG. 1B shows an energy band of a semiconductor in the case of a pin junction. When a Schottky barrier is present between the n-type semiconductor and the electrolytic solution, an electric current flows in a normal direction when the semiconductor is negative, but an electric current does not flow when the semiconductor is positive. Even in this case however, an electron/hole pair is generated by irradiating the semiconductor with light, and the hole migrates to the electrolytic solution to flow an electric current. In this case, since the semiconductor is made positive, a negative ion should be present in the polymer electrodeposition material in the condition of the hydrophilic group being dissociated. In the case where the p-type semiconductor is made negative, on the other hand, a positive ion should be present in the polymer electrodeposition material in the condition of the hydrophilic group being dissociated. In the case where a semiconductor of a pn or pin junction is used, both the ions can be employed. As the negative ion, a carboxyl group can be used, and as the positive ion, an amino group and an imino group can be used.

Figure 2:
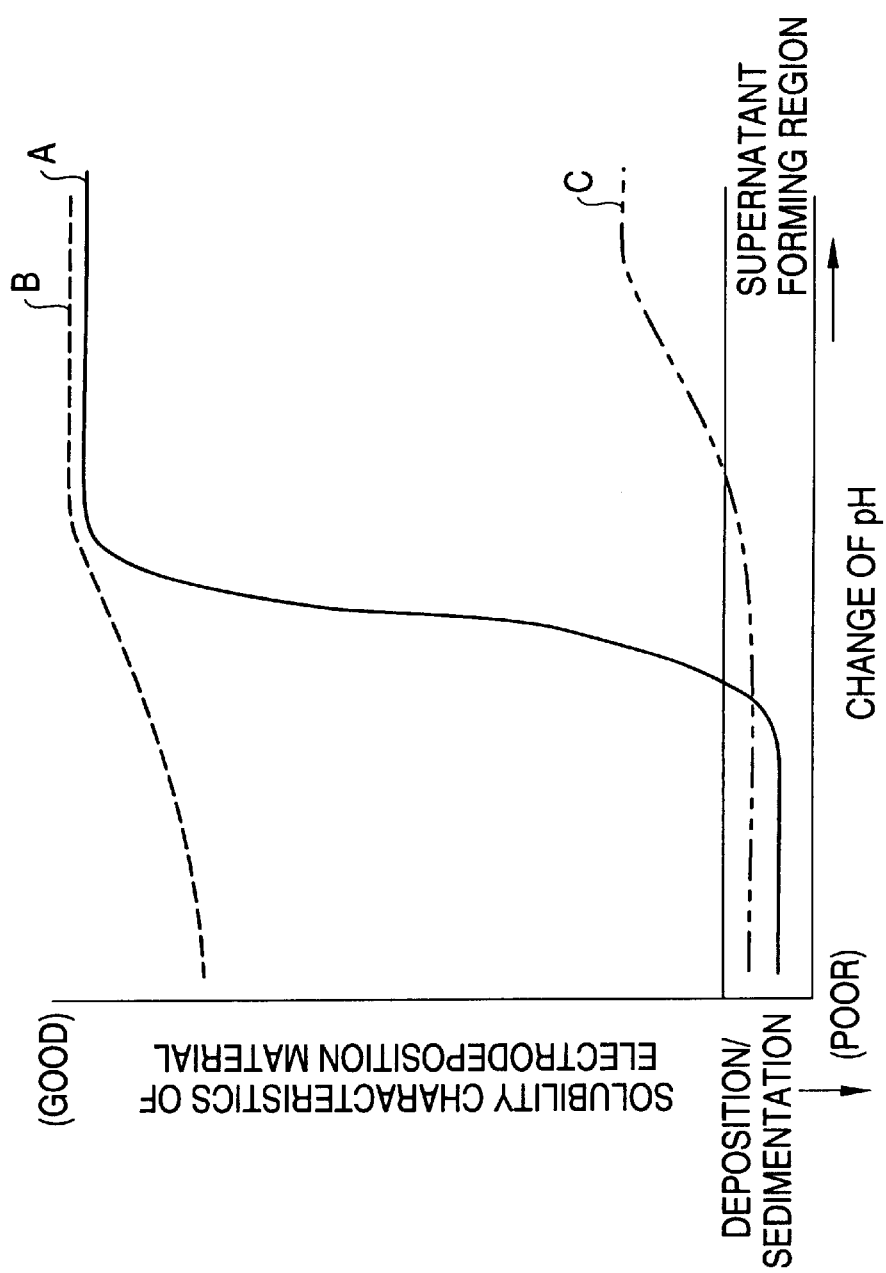
FIG. 2 is a graph showing solubility characteristics of an electrodeposition material depending on the change of pH.

The combination of the solvent and the polymer electrodeposition material is selected with considering the solubility characteristics. FIG. 2 is a graph showing the relationship between the solubility characteristics of the electrodeposition material and the pH of the electrolytic solution. The line A (solid line) means that the electrodeposition material is quickly deposited at a certain pH value or lower, and the line B (broken line) means that the solubility of the material is good irrespective to the pH value of the electrolytic solution, in other words, this material is difficult to form an electrodeposition film. The line C (two-dot chain line) means that the electrodeposition material is insoluble irrespective to the pH value of the electrolytic solution, in other words, an electrolytic solution using this electrodeposition material cannot be prepared. The solubility characteristics change depending on the combination of an electrodeposition material and a solvent. In the invention, as shown by the line A, it is preferred to select a combination of an electrodeposition material and a solvent, by which deposition of the electrodeposition material quickly occurs with the border of a certain pH value. Specifically, such a combination of an electrodeposition material and a solvent is selected in that the pH change of the electrolytic solution is 2 or less, and preferably 1 or less the state where the electrodeposition material is dissolved or dispersed in the electrolytic solution changes to the state where the material precipitates therein. Accordingly, even in the case where the pH is slightly changed by the application of voltage, the electrodeposition material can be immediately deposited. Furthermore, the cohesive force of the deposited electrodeposition material is increased, and the redissolving rate thereof into the electrolytic solution can be lowered, to increase the water resistance of the image.

The pH of the aqueous electrolytic solution is preferably set, in the case where the coloring material is deposited on the anode, to (deposition initiating pH of the polymer electrodeposition material+2)±2, and more preferably (deposition initiating pH of the polymer electrodeposition material+2)±1. In the case where the coloring material is deposited on the cathode, the pH of the aqueous electrolytic solution is preferably set to (deposition initiating pH of the polymer electrodeposition material−2)±2, and more preferably to (deposition initiating pH of the polymer electrodeposition material−2)±1. When the pH of the aqueous electrolytic solution is set outside the above range and on the side where the deposition is more liable to occur than with the deposition initiating pH, the aqueous electrolytic solution becomes unstable, so that the coloring material may be deposited on a non-image part, and the deposited amount becomes uneven. When the pH of the aqueous electrolytic solution is set outside the above range and on the side where the deposition is more difficult to occur than at the deposition initiating pH, the deposition film forming efficiency is low, so that the threshold electric potential may be increased, and the strength of the film thus formed may be decreased.

In order to adjust the pH of the aqueous electrolytic solution to the range described above, the aqueous electrolytic solution may contain a pH adjusting material. Additionally, it may contain a wetting agent, a water soluble thermoplastic polymer, an emulsion material, a latex material, various solvents, a surface active agent and an anti-septic and anti-fungal agent.

When the electrodeposition film is formed under the condition that the solubility of the polymer electrodeposition material is saturated, the polymer electrodeposition material is difficult to be redissolved after the film formation. Therefore, it is preferred that the electrodeposition film is formed by using an aqueous electrolytic solution having such a pH and a concentration of the electrodeposition material that the solubility of the electrodeposition material is saturated.

Figure 3:
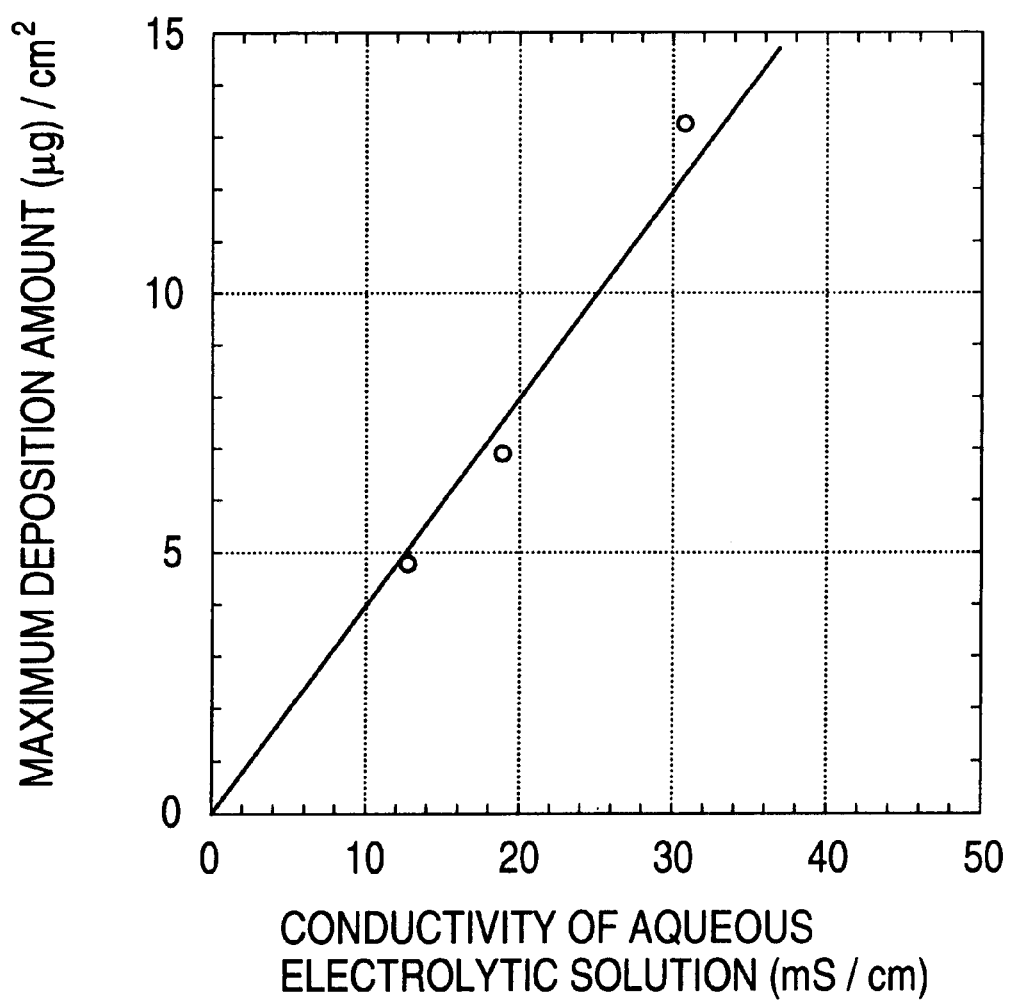
FIG. 3 is a graph showing the change of electrodeposition amount of the electrodeposition material depending on the change of conductivity.

According to experiments, the conductivity of an aqueous electrolytic solution relates to the electrodeposition rate, and the higher the conductivity is, the higher the electrodeposition rate is. When the conductivity becomes higher, the thickness of the electrodeposition film that is deposited for a unit period of time is increased (see FIG. 3), and there is a tendency that the electrodeposition amount is saturated at a conductivity of about 100 mS/cm$^2$. The conductivity of the aqueous electrolytic solution can be converted to the volume resistivity of the aqueous electrolytic solution, and when the volume resistivity is controlled to the range of from $10^1$ to $10^6$ Ω·cm, good electrodeposition can be conducted. When the volume resistivity of the aqueous electrolytic solution exceeds $10^6$ Ω·cm, the electrodeposition amount becomes small since a sufficient electric current cannot be obtained, and when the volume resistivity is lower than 10 Ω·cm, it is difficult to control the electrodeposition amount. In the case where the desired volume resistivity cannot be obtained only by the addition of the polymer electrodeposition material and the coloring material, it is preferred to add ions, a neutral salt, an acidic or alkaline substance that do not influence the electrodeposition characteristics, such as $Na^+$ ions and $Cl^-$ ions.

The concentration of the coloring material in the aqueous electrolytic solution is preferably from 1 to 40% by weight, and more preferably from 3 to 18% by weight. When the concentration of the coloring material is less than 1% by weight, it is difficult to obtain an image having a desired optical density. When the concentration of the coloring material exceeds 40% by weight, background contamination occurs in the non-image part on the image formation, and the electrolytic solution exhibits a higher viscosity and an excessively thixotropic property, to make the handling of the aqueous electrolytic solution complicated.

The viscosity of the aqueous electrolytic solution is preferably in the range of from 1 to 2,000 cps, and more preferably in the range of from 10 to 600 cps. When the viscosity of the aqueous electrolytic solution is less than 1 cps, the viscosity property of the aqueous electrolytic solution is insufficient, and thus scattering of droplets occurs. When the viscosity of the aqueous electrolytic solution exceeds 2,000 cps, the driving load on transferring or stirring the aqueous electrolytic solution is increased to deteriorate the efficiency.

In the aqueous electrolytic solution, the substrate and a counter electrode connected to the substrate are arranged in such a manner that the surface of the substrate, on which the semiconductor thin film is formed, and the counter electrode are immersed therein. The substrate is then irradiated with light from the side of the transparent support, and an electrodeposition film containing the coloring material and the electrodeposition material is deposited on a part of the substrate, in which an electromotive force is generated.

As the counter electrode, a saturated calomel electrode can be used for example.

As an exposure apparatus used for irradiation of light, that which is capable of emitting light that can be absorbed by the semiconductor thin film of the substrate, i.e., light having a wavelength of 400 nm or less, can be used. Specifically, a mercury lamp, a mercury-xenon lamp, an He-Cd laser, an $N_2$ laser and an excimer laser can be used.

The photoelectromotive force of crystalline Si, which has a high efficiency, is 0.6 V at most. Therefore, in the process for recording an image in which a polymer is subjected to a direct oxidation-reduction reaction by the photoelectromotive force, only a conductive polymer having a low threshold voltage, such as polypyrrole, can be obtained. In the invention, however, because the polymer electrodeposition material is deposited by utilizing the change of the solubility of the electrodeposition material due to the change of pH, a non-conductive material, which requires a high application voltage when it is subjected to a direct oxidation-reduction reaction, can be used in addition to a conductive material for the image formation with a low voltage (for example, 5 V or less, and preferably 2 V or less). When the photoelectromotive force exceeds the threshold voltage, no action is needed. When the photoelectromotive force is lower than the threshold voltage, however, an image cannot be formed unless a shortage of voltage is applied as a bias voltage to the substrate. When the photoelectromotive force exceeds the threshold voltage, an image can be formed without the bias voltage. However, the bias voltage exceeds the voltage depending on the band gap of the semiconductor, the Schottky barrier is broken, and the electrodeposition film is formed on the whole surface of the semiconductor substrate including the region that is not irradiated with light. Therefore, the upper limit of the bias voltage is up to the limit of maintaining the Schottky barrier. For example, in the case where a material that is subjected to electrodeposition at 2.0 V is used, when the substrate is irradiated with light while applying a bias voltage of 1.5 V, a value obtained by adding the photoelectromotive force of 0.6 V of the semiconductor to the bias voltage, i.e., 2.1 V, is obtained on the irradiated part. The voltage obtained exceeds the threshold voltage required for electrodeposition, and thus an electrodeposition film is formed only on the region that is irradiated with light. According to the invention, even when a signal entering from the outside is only an optical signal of a low voltage of not forming an image, an arbitrary electrodeposition film (photoelectrodeposition film) can be formed on the desired position.

As is understood from the above description the invention utilizes an electromotive force generated by irradiating a semiconductor with light, but does not utilize the outer photoelectric current effect (the effect that in order to increase an electric current flowing on application of a bias voltage, the conductivity of a semiconductor is increased by irradiation of light) disclosed in JP-5-119209 and JP-5-157905.

Immediately after the formation of the electrodeposition film according to the process described above, an unnecessary electrodeposition solution remains on various parts of the substrate. Effective means for substantially completely removing such an unnecessary aqueous electrolytic solution include washing with a liquid. In particular, washing with a transparent inert liquid having high safety is effective. It is effective on the washing to accelerate solidification of the electrodeposition film immediately after the electrodeposition, which has a small strength, along with removal of the unnecessary solution. In the invention, the electrodeposition film thus deposited is brought into contact with an aqueous liquid having a deposition initiating pH, at which the polymer electrodeposition material initiates to be deposited, or a pH of the side, on which the polymer electrodeposition material is deposited more than at the deposition initiating pH. Through the contact with such an aqueous liquid, the coloring material and the polymer electrodeposition material contained in the unnecessary aqueous electrolytic solution are agglomerated to be washed out from the substrate, and simultaneously the solidification of the electrodeposition film is accelerated, to yeild a high quality image having high durability and high resolution.

In order to conduct the removal of the unnecessary solution and to enhance the solidification of the film, the pH value of the aqueous liquid is preferably such a value that it is shifted from the pH value of the deposition initiation point of the electrodeposition material by 2 or more toward the side on which the electrodeposition material is further deposited.

In the invention, a multicolor image can be recorded in such a manner that the process of deposition of an electrodeposition film is repeated with changing the color tone of the coloring material, and each of the electrodeposition films comes contact with the aqueous liquid after the formation thereof. By using coloring materials having color tones, red (R), green (G) and blue (B), in the process for recording a multicolor image, a color filter part of full color can be formed.

In the case where a polymer electrodeposition material having a high conductivity is used, electrodeposition films can be laminated by this process, and thus color filter layers having different functions can be laminated without color mixing.

In the case where a multicolor image is formed with a material having a high insulating property, after forming the multicolor image, the substrate is arranged in a solution containing a coloring material having a color tone different from the color tones of the coloring materials contained in the multicolor image (including one having the coloring material dissolved therein and one having the coloring material dispersed therein) in such a manner that the surface of the semiconductor thin film of the substrate is immersed therein, and at least one of irradiation with light and application of a voltage to the whole surface of the substrate is conducted, so that a film containing the coloring material having a color tone different from the color tones of the coloring materials contained in the multicolor image can be formed on the part of the substrate, onwhichtheelectrodeposition filmisnot formed. In the process described above, by using carbon black as the coloring material having a color tone different from the color tones of the coloring materials contained in the multicolor image, a black matrix can be formed with high precision on the part, on which the multicolor image is not formed, i.e., the part, on which the semiconductor thin film is exposed, without conducting a lithography process. Even in the case where an ultraviolet ray hardening resin is used, a film of ablack matrix can be well formed on the region, on which the color filter layer is not formed.

On the production of the black matrix, the volume resistivity of the electrodeposition film of the multicolor image is preferably $10^4$ Ω·cm or more.

In the invention, the electrodeposition film thus formed on the substrate can be transferred to another substrate. Because the substrate used for the transfer is not necessary to have a photo semiconductor film absorbing light, a color filter having a high light transmissibility can be realized by the transfer. Heat and pressure can be used on the transfer.

Figure 4A:
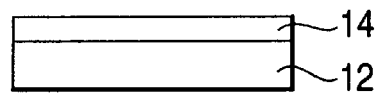
FIGS. 4A to 4E are schematic cross sectional views showing an embodiment of the process for recording an image of the invention when applied to the production of a color filter.
Figure 4B:
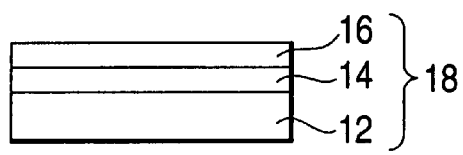

An embodiment, in which the process for recording an image of the invention is applied to the production of a color filter, is described with reference to FIGS. 4A to 4E. A transparent conductive film 14 is formed on a transparent substrate 12 as described above (FIG. 4A). A substrate 18 is prepared by further forming thereon a semiconductor thin film 16 (FIG. 4B).

Figure 5:
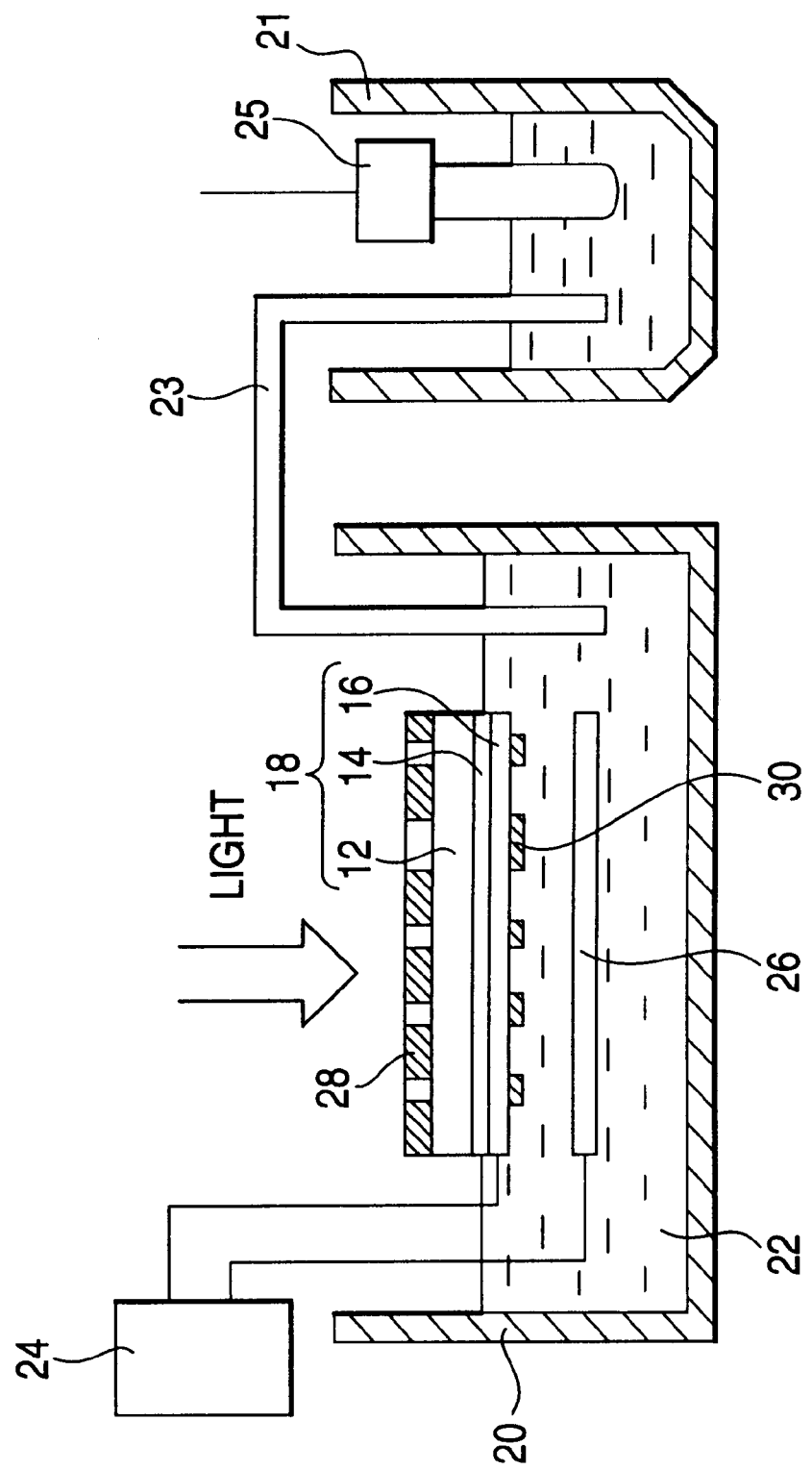
FIG. 5 is a schematic diagram showing an embodiment of an apparatus used in the process for recording an image.

On the other hand, an apparatus having the three-electrode arrangement that has been generally used in the field of electro chemistry as shown in FIG. 5 is prepared. An electrolytic bath 20 is filled with an aqueous electrolytic solution 22 comprising a solvent, a coloring material and an electrodeposition material, whose solubility is changed depending on the change of pH, and a counter electrode 26 connected to a bias power source for electrodeposition 24 is arranged in the electrolytic bath 20. The bias power source for electrodeposition 24 is connected to the transparent conductive film 14, and the substrate 18 is fixed in such a manner that the semiconductor thin film 16 functioning as a working electrode is immersed in the aqueous electrolytic solution 22. Separately, a control unit for a control electrode 25 is arranged in a control electrode bath 21 filled with a saturated potassium chloride aqueous solution as a reference liquid interface, and a control electrode 23 is provided between the electrolytic bath 20 and the control electrode bath 21.

When a prescribed photomask is placed on the transparent support 12 of the substrate 18, and the substrate is irradiated with light, a colored (single-color) electrodeposition film 30 comprising the electrodeposition material and the coloring material is selectively deposited on the part where an electromotive force is generated. The substrate 18 having the electrodeposition film 30 formed thereon is withdrawn from the aqueous electrolytic solution 22, and the electrodeposition film 30 is brought into contact with an aqueous liquid having the deposition initiating pH of the electrodeposition material or a pH of the side, on which the electrodeposition material is deposited more than at the deposition initiating pH, so that the unnecessary aqueous electrolytic solution 22 attached to the substrate 18 is removed, and the electrodeposition film 30 becomes durable. While the part where an electromotive force is generated is determined by using the photomask in this embodiment, an electromotive force can be generated on the desired part by directly writing with a laser light.

Figure 4C:
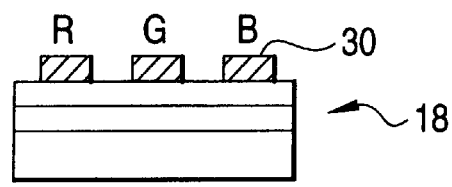
Figure 4D:
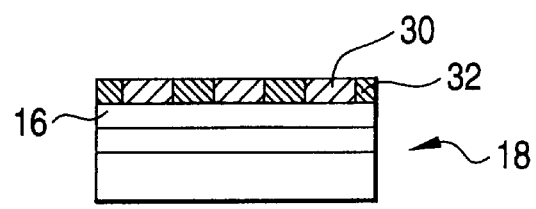

A multicolor color filter can be easily produced by repeating the process for forming a single-color color filter and the process for contacting the electrodeposition film with the aqueous liquid with changing the color tone of the coloring material to red (R), green (G) and blue (B), for example, and also changing the mask pattern (FIG. 4C). Furthermore, a black matrix layer 32 is formed on the part, on which the electrodeposition film 30 is not formed, by irradiating the whole surface of the substrate 18 with light or applying a voltage, to obtain a multicolor color filter (FIG. 4D). In the case where the resulting product is used as a color filter as it is, a protective layer may be formed by using a resin material, such as an acrylic resin, a polyimide resin and a polyester resin, to suppress the deterioration of the electrodeposition film due to the electrolytic solution.

Figure 4E:
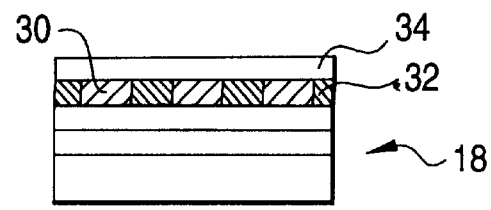

Furthermore, it is possible that the electrodeposition film 30 and the black matrix layer 32 are transferred to the desired substrate, which is then used as a color filter. In this case, a color filter may be obtained by the following manner. A desired filter substrate 40 is adhered to the electrodeposition film 30 and the black matrix layer 32 formed on the transparent substrate 12, and the electrodeposition film 30 and the black matrix layer 32 are transferred to the filter substrate 40 by application of heat and/or pressure (FIG. 4E). The substrate 18 is peeled from the filter substrate 40 to obtain a color filter comprising a filter substrate 40 having thereon the electrodeposition film 30 and the black matrix layer 32 (FIG. 4F).

While an example of the production of a filter comprising RGB and a black mask has been described herein, a filter comprising cyan, magenta and yellow can be produced by adding or changing a coloring material. Such a filter can be suitably used as a reflection type filter. Furthermore, a filter of more than three colors, such as six colors, can be produced.

The invention will be described in more detail with reference to the following examples, but the invention is not construed as being limited thereto.

EXAMPLE 1

An ITO transparent conductive film having a thickness of 0.1 μm was formed on a transparent quartz glass support having a thickness of 1.5 mm by a sputtering method, and similarly a $TiO_2$ film having a thickness of 0.3 μm was also formed thereon. As a reduction treatment to increase the photoelectric current characteristics of $TiO_2$, the $TiO_2$ film was annealed by heating at 460° C. for 10 minutes in a nitrogen/hydrogen mixed gas (hydrogen content: 4%). The resulting substrate was arranged by using the three-electrode type apparatus shown in FIG. 5 that was generally used in the field of electrochemistry in such a manner that the $TiO_2$ film was immersed in an aqueous electrolytic solution (volume resistivity: $2\times10^2$ Ω·cm), in which a s tyrene-acrylic acid random copolymer as an electrodeposition material (number average molecular weight: 16,000, mole ratio of hydrophobic group/ (hydrophilic group+ hydrophobic group): 65%, 75% or more of hydrophilic group being capable of being ionicly dissociated, acid value: 130, glass transition point: 45° C., flow initiating point: 95° C., decomposition point: 237° C., deposition initiating pH value: 5.8) and azo series red pigment super-fine particles were dispersed at a solid content ratio of 7/3. A photomask for R was placed on the quartz glass support of the substrate, and the substrate was irradiated with light for 4 seconds from the side of the quartz glass support by a mercury-xenon lamp (produced by Yamashita Denso Corp., wavelength: 365 nm, light intensity: 50 mW/cm$^2$) with applying a bias voltage of 1.6 V to the $TiO_2$ as a working electrode by using a saturated calomel electrode as a counter electrode. As a result, a red electrodeposition film (volume resistivity: $3\times10^8$ Ω·cm) was formed only on the region of the $TiO_2$ film that was irradiated with light (electrodeposition film forming step). Thereafter, the substrate was thoroughly subjected to cascade washing with an aqueous liquid having pH 3.2. The electrodeposition film forming step described above was repeated except that an aqueous electrolytic solution (volume resistivity: $3\times10^2$ Ω·cm), in which the styrene-acrylic acid copolymer and phthalocyanine series green pigment super-fine particles were dispersed at a solid content ratio of 7/3, was used, the period of time for light irradiation was changed to 5 seconds, and a photomask for G was used. As a result, a green electrodeposition film (volume resistivity: $6\times10^6$ Ω·cm) was formed only on the region of the $TiO_2$ film that was irradiated with light. The substrate was subjected to cascade washing with an aqueous liquid having pH 3.2. Furthermore, the red electrodeposition film forming step described above was repeated except that an aqueous electrolytic solution (volume resistivity: $3\times10^2$ Ω·cm), in which the styrene-acrylic acid copolymer and phthalocyanine series blue pigment super-fine particles were dispersed at a solid content ratio of 7/3, was used, and a photomask for B was used. As a result, a blue electrodeposition film (volume resistivity: $5\times10^7$ Ω·cm) was formed only on the region of the $TiO_2$ film that was irradiated with light. The substrate was thoroughly subjected to cascade washing with an aqueous liquid having pH 3.2. Thereafter, a voltage of 2.2 V was applied to the $TiO_2$ film in an aqueous electrolytic solution, in which a styrene-acrylic acid copolymer (number average molecular weight: 15,000, mole ratio of hydrophobic group/ (hydrophilic group+hydrophobic group): 70%, acid value: 130, deposition initiating pH value: 5.6) and carbon black powder (average particle diameter: 80 nm) were dispersed at a solid content ratio of 1/5. As a result, a black matrix comprising a thin film of carbon black was formed on the region, on which the red, green and blue electrodeposition films (color filter layer) was not formed. Thereafter, the substrate was washed with an aqueous liquid having pH 3.2. A blue glass plate having a thickness of 1 mm was placed on the electrodeposition films, and they were allowed to stand in an oven at 170° C. for 10 minutes with applying a pressure of 250 g/cm$^2$ between the quartz glass support of the substrate and the blue glass plate. The electrodeposition films were transferred to the blue glass plate by peeling the substrate from the blue glass plate to prepare a test piece. The test piece was immersed in pure water for 24 hours, and then the pH value of the water after immersion was measured and was 4.3. This means that the pH of the electrodeposition films is around 4.3, and this value means that the electrodeposition films of the test piece are sufficiently durable. Thereafter, a protective layer was coated on the electrodeposition films to produce a color filter.

COMPARATIVE EXAMPLE 1

The same procedures as in Example 1 were repeated except that the washing step after the electrodeposition was conducted by using an aqueous liquid having pH 7, 8 or 10 instead of the aqueous liquid used in Example 1. In the cases where the aqueous liquids of pH 7 and 8 were used, the film thickness of the electrodeposition film after washing becomes thinner than the film thickness of the electrodeposition film immediately after the electrodeposition, or the electrodeposition film was released off. In the case where the aqueous liquid of pH 10 was used, the electrodeposition film formed in the electrodeposition film forming step was completely washed out, and the presence of the electrodeposition film could not be confirmed by the naked eyes.

EXAMPLE 2

An ITO transparent conductive film having a thickness of 0.2 $\mu$m was formed on a non-alkali glass support having a thickness of 2 mm by a sputtering method, and a $TiO_2$ film having a thickness of 0.5 $\mu$m was formed thereon by a sputtering method. As a reduction treatment to increase the photoelectric current characteristics of $TiO_2$, the $TiO_2$ film was annealed by heating at 420° C. for 20 minutes in a nitrogen/hydrogen mixed gas (hydrogen content: 5%). The resulting substrate was arranged by using the three-electrode type apparatus shown in FIG. 5 that was generally used in the field of electrochemistry in such a manner that the $TiO_2$ film was immersed in an aqueous electrolytic solution (volume resistivity: $3 \times 10^2$ $\Omega \cdot$cm), in which a styrene-acrylic acid random copolymer as an electrodeposition material (number average molecular weight: 14,000, mole ratio of hydrophobic group/ (hydrophilic group+hydrophobic group): 73%, 65% or more of hydrophilic group being capable of being dissociated, acid value: 140, glass transition point: 52° C., flow initiating point: 97° C., decomposition point: 248° C., deposition initiating pH value: 6.0) and azo series red pigment superfine particles were dispersed at a solid content ratio of 9/1. A photomask for R was placed on the glass support of the substrate, and the substrate was irradiated with light for 6 seconds from the side of the glass support by a mercury-xenon lamp (produced by Yamashita Denso Corp., wavelength: 365 nm, light intensity: 50 mW/cm$^2$) with applying a bias voltage of 1.8 V to the $TiO_2$ as a working electrode by using a saturated calomel electrode as a counter electrode. As a result, a red electrodeposition film (volume resistivity: $3 \times 10^8$ $\Omega \cdot$cm) was formed only on the region of the $TiO_2$ film that was irradiated with light (electrodeposition film forming step). Thereafter, the substrate was washed with an aqueous liquid having pH 4.5. The electrodeposition film forming step described above was repeated except that an aqueous electrolytic solution (volume resistivity: $4 \times 10^2$ $\Omega \cdot$cm), in which the styrene-acrylic acid copolymer and phthalocyanine series green pigment super-fine particles were dispersed at a solid content ratio of 8/2, was used, the period of time for light irradiation was changed to 7 seconds, and a photomask for G was used. As a result, a green electrodeposition film (volume resistivity: $6 \times 10^6$ $\Omega \cdot$cm) was formed only on the region of the $TiO_2$ film that was irradiated with light. The substrate was washed with an aqueous liquid having pH 4.4. Furthermore, the red electrodeposition film forming step described above was repeated except that an aqueous electrolytic solution (volume resistivity: $2 \times 10^3$ $\Omega \cdot$cm), in which the styrene-acrylic acid copolymer and phthalocyanine series blue pigment super-fine particles were dispersed at a solid content ratio of 8/2, was used, a photomask for B was used, the applied voltage was changed to 1.9 V, and the period of time for light irradiation was changed to 7 seconds. As a result, a blue electrodeposition film (volume resistivity: $4 \times 10^9 \Omega \cdot$cm was formed only on the region of the $TiO_2$ film that was irradiated with light. The substrate was washed with an aqueous liquid having pH 3.2. Thereafter, the whole surface of the substrate was irradiated with light for 10 seconds by using a mercury-xenon lamp from the side of the glass support in an aqueous electrolytic solution, in which the styrene-acrylic acid copolymer and carbon black powder (average particle diameter: 75 nm) were dispersed at a solid content ratio of 5/5 with applying a voltage of 1.6 V to the $TiO_2$ film. As a result, a black matrix comprising a thin film of carbon black was formed on a region, on which the red, green and blue electrodeposition films (color filter layer) was not formed. Thereafter, the substrate was washed with an aqueous liquid having pH 4.2. A blue glass plate having a thickness of 1 mm was placed on the electrodeposition films, and they were allowed to stand in an oven at 180° C. for 10 minutes with applying a pressure of 490 g/cm$^2$ between the quartz glass support of the substrate and the blue glass plate. The electrodeposition films were transferred to the blue glass plate by peeling the substrate from the blue glass plate to prepare a test piece. The test piece was immersed in pure water for 24 hours, and then the pH value of the water after immersion was measured and was 4.9. This means that the pH of the electrodeposition films is around 4.9, and this value means that the electrodeposition films of the test piece are sufficiently durable. Thereafter, a protective layer was coated on the electrode position films to produce a color filter.

EXAMPLE 3

An ITO transparent conductive film having a thickness of 0.2 $\mu$m was formed on a transparent Pyrex glass support having a thickness of 4.5 mm by a sputtering method. An alkoxide of $TiO_2$ (produced by Nippon Soda Co., Ltd., Atolon NTi-092) was coated on the ITO thin film with the glass support having the ITO thin film being rotated at 1,400 rpm, and the coated film was heated at about 500° C. for 1 hour to form a $TiO_2$ layer having a thickness of 0.8 $\mu$m. As a reduction treatment, the $TiO_2$ film was annealed by heating at 360° C. for 20 minutes in a nitrogen/hydrogen mixed gas (hydrogen content: 4%). The resulting substrate was arranged by using the three-electrode type apparatus shown in FIG. 5 that was generally used in the field of electrochemistry in such a manner that the $TiO_2$ film was immersed in an aqueous electrolytic solution (volume resistivity: $2 \times 10^3$ $\Omega \cdot$cm), in which a styrene-acrylic acid random copolymer as an electrodeposition material (number average molecular weight: 10,000, mole ratio of hydrophobic group/ (hydrophilic group+hydrophobic group): 68%, 80% or more of hydrophilic group being capable of being dissociated, acid value: 160, glass transition point: 35° C., flow initiating point: 85° C., decomposition point: 240° C., deposition initiating pH value: 5.8) and azo series red pigment super-fine particles were dispersed at a solid content ratio of 9/1. A photomask for R was placed on the glass support of the substrate, and the substrate was irradiated with light for 5 seconds from the side of the glass support by a mercury-xenon lamp (produced by Yamashita Denso Corp., wavelength: 365 nm, light intensity: 50 mW/cm$^2$) with applying a bias voltage of 1.7 V to the $TiO_2$ as a working electrode by using a saturated calomel electrode as a counter electrode. As a result, a red electrodeposition film (volume resistivity: $5 \times 10^7 \Omega \cdot$cm) was formed only on the region of the $TiO_2$ film that was irradiated with light (electrodeposition film forming step). Thereafter, the substrate was immersed in an aqueous liquid having pH 4.2. The electrodeposition film forming step described above was repeated except that an aqueous electrolytic solution (volume resistivity: $6 \times 10^2$ $\Omega \cdot$cm), in which the styrene-acrylic acid copolymer and phthalocyanine series green pigment super-fine particles were dispersed at a solid content ratio of 9/1, was used, and a photomask for G was used. As a result, a green electrodeposition film (volume resistivity: $8 \times 10^9$ Ω·cm) was formed only on the region of the $TiO_2$ film that was irradiated with light. The substrate was washed with an aqueous liquid having pH 4.2. Furthermore, the red electrodeposition film forming step described above was repeated except that an aqueous electrolytic solution (volume resistivity: $2 \times 10^3$ Ω·cm), in which the styrene-acrylic acid copolymer and phthalocyanine series blue pigment super-fine particles were dispersed at a solid content ratio of 9/1, was used, and a photomask for B was used. As a result, a blue electrodeposition film (volume resistivity: $4 \times 10^8$ Ω·cm) was formed only on the region of the $TiO_2$ film that was irradiated with light. The substrate was washed with an aqueous liquid having pH 4.2. Thereafter, the whole surface of the substrate was irradiated with light for 7 seconds by using a mercury-xenon lamp from the side of the glass support in an aqueous electrolytic solution, in which the styrene-acrylic acid copolymer and carbon black powder (average particle diameter: 80 nm) were dispersed at a solid content ratio of 9/1 with applying a voltage of 1.6 V to the $TiO_2$ film. As a result, a black matrix comprising a thin film of carbon black was formed on the region, on which the red, green and blue electrodeposition films (color filter layer) was not formed. Thereafter, the substrate was washed with an aqueous liquid having pH 4.2. A polyimide film having a thickness of 0.2 mm was placed on the electrodeposition films, and they were passed through between two rollers, which were heated to have a surface temperature of 155° C., at a linear pressure of 300 g/cm and a linear speed of 20 mm/sec to conduct a treatment of applying heat and pressure. Thereafter, the electrodeposition films were transferred to the polyimide film by peeling the polyimide film from the substrate to prepare a test piece. The test piece was immersed in pure water for 24 hours, and then the pH value of the water after immersion was measured and was 5.2. This means that the pH of the electrodeposition films is around 5.2, and this value means that the electrodeposition films of the test piece are sufficiently durable. Thereafter, a protective layer was coated on the electrodeposition films to produce a color filter.

EXAMPLE 4

An ITO transparent conductive film having a thickness of 0.3 μm was formed on a transparent quartz glass support having a thickness of 3 mm by a sputtering method, and a silane gas was introduced on the ITO conductive film by a glow discharge deposition method with a diborane gas being introduced in the course of the film formation, so that an a-Si film (amorphous Si film) and a p-type a-Si film were accumulated to form a photoelectromotive layer having a thickness of 0.8 μm. The substrate was heated to the surface temperature of about 550° C. with a laser light to increase the crystallinity of the Si film, to form a pn junction poly-Si film. The resulting substrate was arranged by using the three-electrode type apparatus shown in FIG. 5 that was generally used in the field of electrochemistry in such a manner that the Si film was immersed in a weak alkaline aqueous electrolytic solution (volume resistivity: $9 \times 10^2$ Ω·cm), in which the styrene-acrylic acid random copolymer used in Example 1 as an electrodeposition material (number average molecular weight: 16,000, molar ratio of hydrophobic group/ (hydrophilic group+hydrophobic group): 65%, 98% or more of hydrophilic group being capable of being dissociated, acidvalue: 130, glass transition point: 45° C., flow initiating point: 95° C., decomposition point: 237° C., deposition initiating pH value: 5.8) and azo series red pigment superfine particles were dispersed at a solid content ratio of 7/3. The substrate was irradiated with laser light with a signal corresponding to red filter pixels by using an He-Ne laser light source with applying a bias voltage of 1.7 V to the Si as a working electrode by using a saturated calomel electrode as a counter electrode. As a result, a red electrodeposition film (volume resistivity: $7 \times 10^8$ Ω·cm) was formed only on the region of the Si film that was irradiated with light (electrodeposition film forming step). Thereafter, the substrate was immersed in an aqueous liquid having pH 3.0. The electrodeposition film forming step described above was repeated except that an aqueous electrolytic solution (volume resistivity: $4 \times 10^3$ Ω·cm), in which the styrene-acrylic acid copolymer and phthalocyanine series green pigment super-fine particles were dispersed at a solid content ratio of 7/3, was used, and irradiation of laser light was conducted with a signal corresponding to green filter pixels. As a result, a green electrodeposition film (volume resistivity: $4 \times 10^7$ Ω·cm) was formed only on the region of the Si film that was irradiated with light. The substrate was immersed in an aqueous liquid having pH 3.0. Furthermore, the electrodeposition film forming step described above was repeated except that an aqueous electrolytic solution (volume resistivity: $3 \times 10^2$ Ω·cm), in which the styrene-acrylic acid copolymer and phthalocyanine series blue pigment super-fine particles were dispersed at a solid content ratio of 7/3, was used, and irradiation of laser light was conducted with a signal corresponding to blue filter pixels. As a result, a blue electrodeposition film (volume resistivity: $7 \times 10^8$ Ω·cm) was formed only on the region of the Si film that was irradiated with light. The substrate was immersed in an aqueous liquid having pH 3.0. Thereafter, the substrate was brought into contact with an ultraviolet-curing resin solution having carbon black powder (average particle diameter: 110 nm) dispersed therein, and the substrate was irradiated with an ultraviolet ray from the side of the glass support. As a result, a black matrix comprising a thin film of carbon black was formed on a region, on which the red, green and blue electrodeposition films (color filter layer) was not formed. A polyimide film having a thickness of 0.2 mm was placed on the electrodeposition films, and they were passed through between two rollers, which were heated to have a surface temperature of 160° C. at a linear pressure of 300 g/cm and a linear speed of 10 mm/sec to conduct a treatment of applying heat and pressure. Thereafter, the electrodeposition films were transferred to the polyimide film by peeling the polyimide film from the substrate to prepare a test piece. The test piece was immersed in pure water for 24 hours, and then the pH value of the water after immersion was measured and was 4.8. This means that the pH of the electrodeposition films is around 4.8, and this value means that the electrodeposition films of the test piece are sufficiently durable. Thereafter, a protective layer was coated on the electrodeposition films to produce a color filter.

EXAMPLE 5

An ITO transparent conductive film having a thickness of 0.2 gm was formed on a transparent quartz glass support having a thickness of 5 mm by a sputtering method, and a $Zn_3P_2$ film was formed by a sputtering method, followed by forming a ZnO layer by a sputtering method, to form a photoelectromotive force layer having a thickness of 0.8 μm. The photoelectromotive force layer was then heated to about 250° C. for 1 hour to stabilize the characteristics of the photoelectromotive force layer, so as to prepare a junction type photoelectromotive force film. The resulting substrate was arranged by using the three-electrode type apparatus shown in FIG. 5 that was generally used in the field of electrochemistry in such a manner that the photoelectromotive force layer was immersed in a weak alkaline aqueous electrolytic solution (volume resistivity: $2\times10^2$ Ω·cm), in which the styrene-acrylic acid random copolymer used in Example 1 as an electrodeposition material (number average molecular weight: 16,000, mole ratio of hydrophobic group/(hydrophilic group+hydrophobic group) : 65%, 93% or more of hydrophilic group being capable of being dissociated, acid value: 130, glass transition point: 45° C., flow initiating point: 95° C., decomposition point: 237° C., deposition initiating pH value: 5.8) and azo series red pigment super-fine particles were dispersed at a solid content ratio of 7/3. A photomask for R was placed on the quartz glass support of the substrate, and the substrate was irradiated with light for 7 seconds from the side of the quartz glass support by a mercury-xenon lamp (produced by Yamashita Denso Corp., wavelength: 365 nm, light intensity: 50 mW/cm$^2$) with applying a bias voltage of 1.7 V to the photoelectromotive force layer as a working electrode by using a saturated calomel electrode as a counter electrode. As a result, a red electrodeposition film (volume resistivity: $3\times10^8$ Ω·cm) was formed only on the region of the photoelectromotive force layer that was irradiated with light (electrodeposition film forming step). Thereafter, the substrate was immersed in an aqueous liquid having pH 4.0. The electrodeposition film forming step described above was repeated except that an aqueous electrolytic solution (volume resistivity: $3\times10^2$ Ω·cm), in which the styrene-acrylic acid copolymer and phthalocyanine series green pigment super-fine particles were dispersed at a solid content ratio of 7/3, was used, and a photomask for G was used. As a result, a green electrodeposition film (volume resistivity: $7\times10^9$ Ω·cm) was formed only on the region of the photoelectromotive force layer that was irradiated with light. The substrate was washed with an aqueous liquid having pH 3.7. Furthermore, the electrodeposition film forming step described above was repeated except that an aqueous electrolytic solution (volume resistivity: $4\times10^2$ Ω·cm), in which the styrene-acrylic acid copolymer and phthalocyanine series blue pigment super-fine particles were dispersed at a solid content ratio of 7/3, was used, and a photomask for B was used. As a result, a blue electrodeposition film (volume resistivity: $6\times10^8$ Ω·cm) was formed only on the region of the photoelectromotive force layer that was irradiated with light. The substrate was immersed in an aqueous liquid having pH 3.2. Thereafter, the substrate was made in contact with an ultraviolet-curing resin solution having carbon black powder (average particle diameter: 110 nm) dispersed therein, and the substrate was irradiated with an ultraviolet ray from the side of the glass support. As a result, a black matrix comprising a thin film of carbon black was formed on a region, on which the red, green and blue electrodeposition films (color filter layer) was not formed. An acrylic resin plate having a thickness of 1 mm was placed on the electrodeposition films, and they were passed through between two rollers, which was heated to have a surface temperature of 180° C., at a linear pressure of 300 g/cm and a linear speed of 3 mm/sec to conduct a treatment of applying heat and pressure. Thereafter, the electrodeposition films were transferred to the acrylic resin plate by peeling the acrylic resin plate from the substrate to prepare a test piece. The test piece was immersed in an aqueous liquid having pH 3.2. The test piece was immersed in pure water for 24 hours, and then the pH value of the water after immersion was measured and was 4.4. This means that the pH of the electrodeposition films is around 4.8, and this value means that the electrodeposition films of the test piece are sufficiently durable. Thereafter, a protective layer was coated on the electrodeposition films to produce a color filter.

COMPARATIVE EXAMPLE 2

The same procedures as in Example 5 were repeated except that the substrate was immersed in an aqueous liquid having pH 8.5 instead of the aqueous liquid having pH 3.2. As a result, swelling and releasing of the electrodeposition material occurred at a boundary of the electrodeposition film pattern formed by the electrodeposition step, and deterioration of the electrodeposition film occurred.

EXAMPLE 6

An ITO transparent conductive film having a thickness of 0.2 μm was formed on a transparent Pyrex glass support having a thickness of 5 mm by a sputtering method. An alkoxide of $TiO_2$ (produced by Nippon Soda Co., Ltd., Atolon NTi-092) was coated on the ITO thin film with the glass support having the ITO thin film being rotated at 1,400 rpm, and the coated film was heated at about 500° C. for 1 hour to form a $TiO_2$ layer having a thickness of 0.8 μm. As a reduction treatment, the $TiO_2$ film was annealed by heating at 360° C. for 20 minutes in a nitrogen/hydrogen mixed gas (hydrogen content: 4%). The resulting substrate was arranged by using the three-electrode type apparatus shown in FIG. 5 that was generally used in the field of electrochemistry in such a manner that the $TiO_2$ film was immersed in an aqueous electrolytic solution (volume resistivity: $9\times10^1$ Ω·cm), in which a styrene-acrylic acid random copolymer as an electrodeposition material (number average molecular weight: 10,000, mole ratio of hydrophobic group/(hydrophilic group+hydrophobic group) : 68%, 99% or more of hydrophilic group being capable of being dissociated, acid value: 160, glass transition point: 35° C., flow initiating point: 85° C., decomposition point: 240° C., deposition initiating pH value: 5.8) and azo series magenta pigment super-fine particles were dispersed at a solid content ratio of 9/1. A photomask for magenta was placed on the glass support of the substrate, and the substrate was irradiated with light for 5 seconds from the side of the glass support by a mercury-xenon lamp (produced by Yamashita Denso Corp., wavelength: 365 nm, light intensity: 50 mW/cm$^2$) with applying a bias voltage of 1.7 V to the $TiO_2$ as a working electrode by using a saturated calomel electrode as a counter electrode. As a result, a magenta electrodeposition film (volume resistivity: $6\times10^6$ Ω·cm) was formed only on the region of the $TiO_2$ film that was irradiated with light (electrodeposition film forming step). Thereafter, the substrate was immersed in an aqueous liquid having pH 3.1. The electrodeposition film forming step described above was repeated except that an aqueous electrolytic solution (volume resistivity: $1\times10^2$ Ω·cm), in which the styrene-acrylic acid copolymer and phthalocyanine series cyan pigment super-fine particles were dispersed at a solid content ratio of 9/1, was used, and a photomask for cyan was used. As a result, a cyan electrodeposition film (volume resistivity: $5\times10^6$ Ω·cm) was formed only on the region of the $TiO_2$ film that was irradiated with light. The substrate was washed with an aqueous liquid having pH 3.1. Furthermore, the electrodeposition film forming step described above was repeated except that an aqueous electrolytic solution (volume resistivity: $3\times10^2$ Ω·cm), in which the styrene-acrylic acid copolymer and azo series yellow pigment super-fine particles were dispersed at a solid content ratio of 9/1, was used, and a photomask for yellow was used. As a result, a yellow electrodeposition film (volume resistivity: $7 \times 10^8$ Ω·cm) was formed only on the region of the $TiO_2$ film that was irradiated with light. The substrate was washed with an aqueous liquid having pH 3.2. Coated paper was placed on the electrodeposition films, and they were passed through between two rollers, which was heated to have a surface temperature of 170° C., at a linear pressure of 450 g/cm and a linear speed of 50 mm/sec to conduct a treatment of applying heat and pressure. Thereafter, the electrodeposition films were transferred to the coated paper by peeling the coated paper from the substrate to prepare a test piece. The test piece was immersed in pure water for 24 hours, and then the pH value of the water after immersion was measured and was 4.3. This means that the pH of the electrodeposition films is around 4.3, and this value means that the electrodeposition films of the test piece are sufficiently durable.

According to the process for recording an image of the invention, input can be conducted with light, and a high quality image can be easily recorded.

What is claimed is:

1. A process for recording an image comprising the steps of:
    preparing a substrate comprising a transparent support having formed thereon a transparent conductive film and an organic or inorganic semiconductor thin film that generates an electromotive force by irradiation of light formed on said transparent conductive film, and an aqueous electrolytic solution containing a solvent, a coloring material and a polymer electrodeposition material, wherein the solubility in said solvent changes depending on the change in pH;
    arranging said substrate and a counter electrode connected to said substrate so that a surface of said substrate, on which said semiconductor thin film is formed, and said counter electrode are immersed in said aqueous electrolytic solution;
    selectively irradiating sad substrate with light;
    depositing an electrodeposition film comprising said coloring material and said polymer electrodeposition material on the part of said substrate, on which an electromotive force is generated; and
    contacting said deposited electrodeposition film with an aqueous liquid having a pH that causes more of said polymer electrodeposition material to be deposited than when said electrodeposition material is contacted with said aqueous liquid having said deposition initiating pH.

2. The process for recording an image as claimed in claim 1, wherein said step of depositing said electrodeposition film and said step of contacting said electrodeposition film with said aqueous liquid are repeated to form a multicolor image.

3. The process for recording an image as claimed in claim 2, wherein said process further comprises, after forming said multicolor image, a step of arranging said substrate in such manner that the surface of said substrate, on which said semiconductor thin film is formed, is immersed in a solution containing a coloring material having a color tone different from color tones of said coloring materials contained in said multicolor image; and forming a film containing said coloring material having a color tone different from color tones of said coloring materials contained in said multicolor image on a part of said substrate, on which said electrodeposition films are not formed, by at least one of light irradiation on the whole surface of said substrate and application of a voltage.

4. The process for recording an image as claimed in claim 1, wherein said process further comprises a step of transferring said electrodeposition film formed on said substrate to another substrate.

5. The process for recording an image as claimed in claim 1, wherein said electrodeposition film has a volume resistivity of $10^4$ Ω·cm or more.

6. The process for recording an image as claimed in claim 1, wherein said semiconductor thin film comprises an n-type semiconductor or a semiconductor having a pn junction or a pin junction, and said polymer electrodeposition material contains a carboxyl group.

7. The process for recording an image as claimed in claim 1, wherein said semiconductor thin film comprises a p-type semiconductor or a semiconductor having a pn junction or a pin junction, and said polymer electrodeposition material contains an amino group or an imino group.

8. The process for recording an image as claimed in claim 1, wherein said semiconductor thin film comprises an n-type compound semiconductor.

9. A process for recording an image as claimed in claim 1, wherein a protective layer is further provided on said electrodeposition film.

10. The process for recording an image as claimed in claim 1, wherein in said step of depositing said electrodeposition film, a voltage of 5 V or less is applied to said substrate.

11. The process for recording an image as claimed in claim 1, wherein said aqueous electrolytic solution has a volume resistivity of from 10 to $10^6$ Ω·cm.

12. The process for recording an image as claimed in claim 4, wherein said electrodeposition film formed on said substrate is transferred to another substrate by applying at least one of heat and pressure.

13. The process for recording an image as claimed in claim 11, wherein said polymer electrodeposition material comprises a random copolymer having a hydrophobic group and a hydrophilic group in its molecule, and the number of said hydrophobic group is from 40 to 80% of the total number of said hydrophobic group and said hydrophilic group.

14. The process for recording an image as claimed in claim 13, wherein 50% or more of said hydrophilic group are capable of suffering ionic dissociation.

15. A process for recording an image comprising the steps of:
    preparing a substrate comprising a transparent support having formed thereon a transparent conductive film and an organic or inorganic semiconductor thin film that generates an electromotive force by irradiation of light formed on said transparent conductive film, and a washing, rinsing, solution containing a solvent, a coloring material and a polymer electrodeposition material, wherein the solubility in said solvent changes depending on the change in pH;
    arranging said substrate and a counter electrode connected to said substrate so that a surface of said substrate, on which said semiconductor thin film is formed, and said counter electrode are immersed in said washing, rinsing, solution;
    selectively irradiating said substrate with light;
    depositing an electrodeposition film comprising said coloring material and said polymer electrodeposition material on the part of said substrate, on which an electromotive force is generated; and
    contacting said deposited electrodeposition film with either an aqueous liquid having a deposition initiating pH, that initiates said polymer electrodeposition material to be deposited, or an aqueous liquid having a pH that causes more of said polymer electrodeposition material to be deposited than when said electrodeposition material is contacted with said aqueous liquid having said deposition initiating pH.

* * * * *